United States Patent
Heo et al.

(10) Patent No.: US 7,389,470 B2
(45) Date of Patent: Jun. 17, 2008

(54) CONCATENATED EQUALIZER/TRELLIS DECODER ARCHITECTURE FOR AN HDTV RECEIVER

(75) Inventors: Seo Weon Heo, Seoul (KR); Jeongsoon Park, West Lafayette, IN (US); Saul Gelfand, Lafayette, IN (US); Ivonete Markman, Carmel, IN (US)

(73) Assignee: Thomson Licensing, Boulogne Billancourt (FR)

( * ) Notice: Subject to any disclaimer, the term of this patent is extended or adjusted under 35 U.S.C. 154(b) by 650 days.

(21) Appl. No.: 10/511,401

(22) PCT Filed: Apr. 9, 2003

(86) PCT No.: PCT/US03/10888

§ 371 (c)(1),
(2), (4) Date: Oct. 14, 2004

(87) PCT Pub. No.: WO03/090439

PCT Pub. Date: Oct. 30, 2003

(65) Prior Publication Data

US 2005/0154967 A1   Jul. 14, 2005

Related U.S. Application Data

(60) Provisional application No. 60/373,008, filed on Apr. 16, 2002.

(51) Int. Cl.
H03M 13/45 (2006.01)
(52) U.S. Cl. .................................... 714/792; 375/233

(58) Field of Classification Search .............. 375/233; 714/792
See application file for complete search history.

(56) References Cited

U.S. PATENT DOCUMENTS 4,833,693 A    5/1989    Eyuboglu (Continued)

FOREIGN PATENT DOCUMENTS

EP    1065851    1/2001

OTHER PUBLICATIONS

Zhuang, W. et al.: "Trellis-Coded CPFSK and Soft-Decision Feedback Equalization For Micro-Cellular Wireless Applications", Wireless Personal Communcations, Springer, Dordrecht, NL, vol. 1, No. 4, Jan. 1994, pp. 271-285, XP000524510.

(Continued)

*Primary Examiner*—Stephen M. Baker
(74) *Attorney, Agent, or Firm*—Joseph J. Laks; Paul P. Kiel

(57) ABSTRACT

A concatenated equalizer/trellis decoding system for use in processing a High Definition Television signal. The re-encoded trellis decoder output, rather than the equalizer output, is used as an input to the feedback filter of the decision feedback equalizer. Hard or soft decision trellis decoding may be applied. In order to account for the latency associated with trellis decoding and the presence of twelve interleaved decoders, feedback from the trellis decoder to the equalizer is performed by replicating the trellis decoder and equalizer hardware in a module that can be cascaded in as many stages as needed to achieve the desired balance between complexity and performance. The present system offers an improvement of between 0.6 and 1.9 decibels. Cascading of two modules is usually sufficient to achieve most of the potential performance improvement.

24 Claims, 4 Drawing Sheets

U.S. PATENT DOCUMENTS

| | | | |
|---|---|---|---|
| 5,031,195 A * | 7/1991 | Chevillat et al. | 375/234 |
| 5,056,117 A | 10/1991 | Gitlin et al. | |
| 5,353,307 A | 10/1994 | Lester et al. | |
| 5,453,797 A | 9/1995 | Nicolas et al. | |
| 5,666,170 A * | 9/1997 | Stewart | 348/726 |
| 6,690,723 B1 * | 2/2004 | Gosse et al. | 375/233 |
| 6,690,739 B1 * | 2/2004 | Mui | 375/265 |

OTHER PUBLICATIONS

Chan, A. M. et al..: "A Class of Block-Interactive Equalizers for Intersymbol Interference Channels: Fixed Channel Results", IEEE Transactions on Communications, vol. 49, No. 11, Nov. 2001, pp. 1966-1976, XP011010052.

Ariyavisitakul, S. et al.: "Joint Coding and Decision Feedback Equalization for Broadband Wireless Channels", Proc. 48th. IEEE Vehicular Technology Conference, vol. vol. 3, Conf. 48, May 18, 1998, pp. 2256-2261, XP000903422, Ottawa, Canada.

Nicolas, J. J. et al.: "Equalization and Interference Rejection for the Terrestrial Broadcast of Digital HDTV", Proceedings of the International Conference on Acoustics, Speech, and Signal Processing (ICASSP), New York, IEEE, US, vol. vol. 4, Apr. 27, 1993, pp. 176-179, XP010110760, Minneapolis, USA.

Blackmon, F. et al.: "Performance Comparison of Interactive/Integral Equalizer/Decoder Structures for Underwater Acoustic Channels", MTS/IEEE Oceans 2001. An Ocean Odyssey. Conference Proceedings (IEEE Cat. No. 01CH37295) Marine Technol. Soc., Washington, DC, USA, vol. 4, 2001, pp. 2191-2200, vol. XP002373997.

Supplementary European Search Report Dated Mar. 27, 2006.

W. Zhuang et al. "Adaptive Soft-Decision Feedback Equalization for Indoor Radio Communications Using Trellis-Coded CPFSK", 44th IEEE Vehicular Technology Conference, Jun. 1994, pp. 1364-1368, especially Figure 2.

* cited by examiner

CONCATENATED EQUALIZER/TRELLIS DECODER ARCHITECTURE FOR AN HDTV RECEIVER

This application claims the benefit, under 35 U.S.C. § 365 of International Application PCT/US03/10888, filed Apr. 9, 2003, which was published in accordance with PCT Article 21(2) on Oct. 30, 2003 in English and which claims the benefit of U.S. provisional patent application No. 60/373,008, filed on Apr. 16, 2002.

BACKGROUND

1. Field of the Invention

This invention relates generally to the field of digital signal processing and more particularly to a concatenated equalizer/trellis decoder suitable for decoding multiple mode trellis encoded High Definition Television (HDTV) signals.

2. Background of the Invention

The Advanced Television Systems Committee (ATSC) standard for HDTV in the United States specifies an eight (eight levels per symbol) vestigial sideband (VSB) transmission system as described in the "ATSC Digital Television Standard", Document A/53 published on Sep. 16, 1995. This document sets forth all the requirements regarding HDTV signal characteristics. In the receiver, an equalizer is included which is an adaptive filter which receives the VSB data stream at an average rate equal to the symbol rate of approximately 10.76 MHz. The equalizer attempts to remove linear distortions mainly caused by multipath signal propagation, which is characteristic of terrestrial broadcast channels. One equalizer design suitable for use in an HDTV receiver is a decision feedback equalizer (DFE) as described in John G. Proakis, "Digital Communications", McGraw-Hill, 2nd edition, 1989, New York and in U.S. Pat. no. 6,493,409, entitled PHASE DETECTORS IN CARRIER RECOVERY FOR OFFSET QAM AND VSB, issued on Dec. 10, 2002 to Lin et al. A simplified block diagram of a typical DFE architecture is shown in FIG. 1. The DFE is seen to include a Feed Forward Filter (FFF), a Feedback Filter (FBF), a slicer, a lock detector and a mode switch, and is capable of operating in training, blind or decision directed (dd) modes.

The functions of the FFF, FBF and the slicer are well known and together they perform the basic functions of filtering and quantization. The lock detector compares the equalizer output and the slicer levels with a threshold, and in response to that operation generates an updated lock detector output. The mode switch chooses the appropriate input to the FBF filter as well as selecting the error and control signals to be used in performing the equalizer adaptation according to the current equalizer operating mode. The mode switch also examines the lock detector output. In normal operation, the equalizer mode switch has an automatic switching capability, which depends on the status of the equalizer lock detector. The mode switch assumes that the training and blind modes are used for convergence purposes only. After the equalizer lock detector senses convergence, the equalizer is then switched to the decision directed (dd) mode. Whenever convergence is lost, the mode switch returns the equalizer to the training or blind mode.

In the ATSC standard, a training sequence is included in the field sync signal in order to provide a mechanism for initial equalizer convergence. The received sequence of coded symbols serves as the input to a synchronization control unit, which detects field and segment synchronization patterns within the symbol sequence and generates the corresponding sync signals. In the training mode, the equalizer coefficients are only updated during the field sync pulse. The drawbacks of this method are that it requires the prior correct detection of the field sync, and since the training sequence is contained in the field sync, which occurs only once every 25 milliseconds, the rate of convergence is possibly decreased. In an environment of multiple reflected or ghost signals, or in other dynamic environments, the detection of the field sync may be difficult. In those situations the receiver needs some self recovering or blind method of initially adjusting equalizer tap coefficients without referring to the training sequence. Since a blind algorithm works with every data symbol it will also tend to have a faster rate of convergence. An example of a blind convergence algorithm is Godard's Constant Modulus Algorithm (CMA). See D. N. Godard, "Self-Recovering Equalization and Carrier Tracking in Two Dimensional Data Communication Systems", IEEE Transactions on Communications, Vol. COM-28, pp.1867-1875, November 1980. See also D. N. Godard, U.S. Pat. No. 4,309,770.

The final mode of equalizer operation, decision directed (dd), assumes that the input to the feedback filter (FBF) is the output of the slicer. Since the adaptation error and the input to the feedback filter are aided by the presence of the slicer, coefficient adaptation occurs throughout the data sequence. The dd mode does not have good convergence characteristics, but once convergence is achieved it has advantages when compared to the other modes of equalizer operation. The presence of the slicer data results in a reduced mean squared error (MSE) and bit error rate (BER) at the equalizer output when compared to operation in the blind mode. Since the dd mode updates its coefficients with every symbol rather than interpreting just the training symbols, the dd mode provides faster adaptation and tracking capabilities than the training mode.

Trellis coding is used in combination with other techniques to protect against interference from particular noise sources. Trellis coding requirements for HDTV are presented in sections 4.2.4-4.2.6 (Annex D), 10.2.3.9, 10.2.3.10 and other sections of the Digital Television Standards for HDTV Transmission of Apr. 12, 1995 prepared by the ATSC. The HDTV standard presents a trellis coding system that employs an interleaving function involving twelve parallel trellis encoders at a transmitter and twelve parallel trellis decoders at a receiver for processing twelve interleaved data streams. The trellis system employed utilizes a rate ⅔ trellis coded modulation (TCM) code. The code is implemented by coding one bit using a rate ½, four state convolutional encoder, and then adding an FEC uncoded bit which is differentially precoded. Each set of three coded bits produced by the encoder is mapped to an eight level VSB modulator symbol. FIG. 2 is a block diagram showing the differential precoder, trellis encoder and corresponding eight level VSB symbol mapper. The twelve identical encoders and precoders are used sequentially, processing each one byte at a time and subsequently transmitting one complete symbol at a time. For each encoder, the input data bits X1 and X2 are encoded as three bits Z2, Z1, and Z0. Each three-bit word corresponds to one of the eight symbols R. The input bit X2 is processed by a precoder to provide encoded bit Z2. The input bit X1 is encoded as two bits Z1 and Z0 by the trellis encoder. An example of a trellis decoder used in an HDTV receiver is disclosed in U.S. Pat. No. 5,841,478, entitled CODE SEQUENCE DETECTION IN A TRELLIS DECODER, issued on Nov. 24, 1998 to Hu, et al.

The use of DFE techniques has been the subject of controversy in the field of receiver design. While DFE offers a relatively simple method for equalizing a highly dispersive linear channel, it may suffer from error propagation, a mechanism whereby incorrect source symbol estimates may cause future decision errors leading to potentially lengthy error bursts. In the HDTV receiver, when the terrestrial channel introduces multipath and white noise, particularly when the multipath signal is strong and the signal to noise ratio (SNR) is low, error propagation in the feedback filter (FBF) of the equalizer (DFE) affects the performance at the output of the trellis decoder. Simulation of an ATSC receiver including a Decision Feedback Equalizer (DFE) for an HDTV terrestrial channel having strong multipath and Additive White Gaussian Noise (AWGN) shows that receiver performance can be improved if the decision directed mode is replaced by a soft decision directed mode, whereby the input to the FBF filter is the equalizer output instead of the slicer output. In addition, ideally the equalizer feedback filter should receive more accurate symbol decisions than those provided by the equalizer slicer.

SUMMARY OF THE INVENTION

The present invention provides a further improvement in HDTV receiver performance by using a concatenated equalizer/trellis decoder structure. Re-encoded trellis decoder outputs, rather than the equalizer output, are used as the input signal to the feedback filter of the Decision Feedback Equalizer (DFE). Due to the latency associated with trellis decoding and the fact that the trellis decoder is actually composed of twelve interleaved decoders, the feedback from the trellis decoder to the equalizer cannot be implemented in real time. The present architecture performs the feedback operation by providing an additional trellis decoder and equalizer along with an additional delay unit to provide data synchronization. The structure is modular and each module can be cascaded in as many stages as needed in order to achieve the desired balance between complexity and performance. In addition, a soft output trellis decoding algorithm may be employed to improve performance. Although this disclosure is directed to the ATSC HDTV system, the present invention may also be utilized in any receiver in which a DFE is followed by a trellis or convolutional decoder.

DETAILED DESCRIPTION

Figure 1:
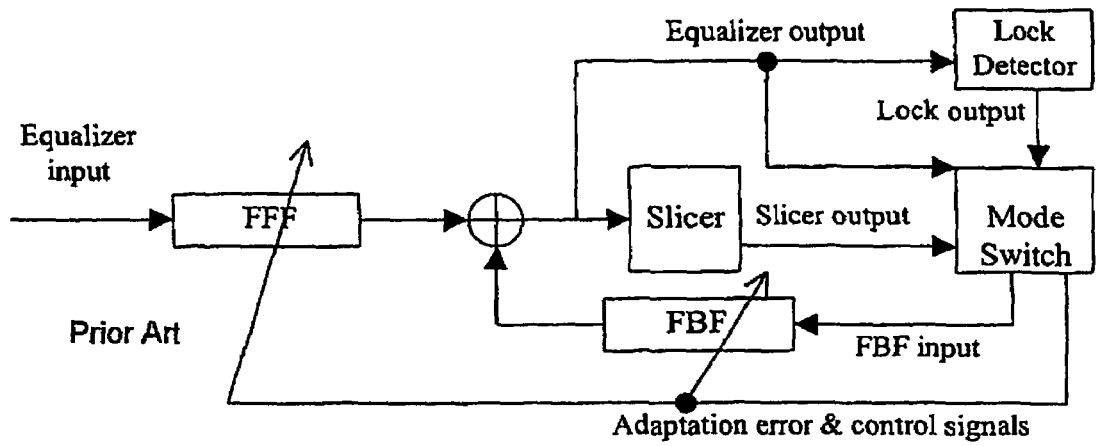
FIG. 1 is a simplified block diagram of a prior art Decision Feedback Equalizer architecture.
Figure 2:
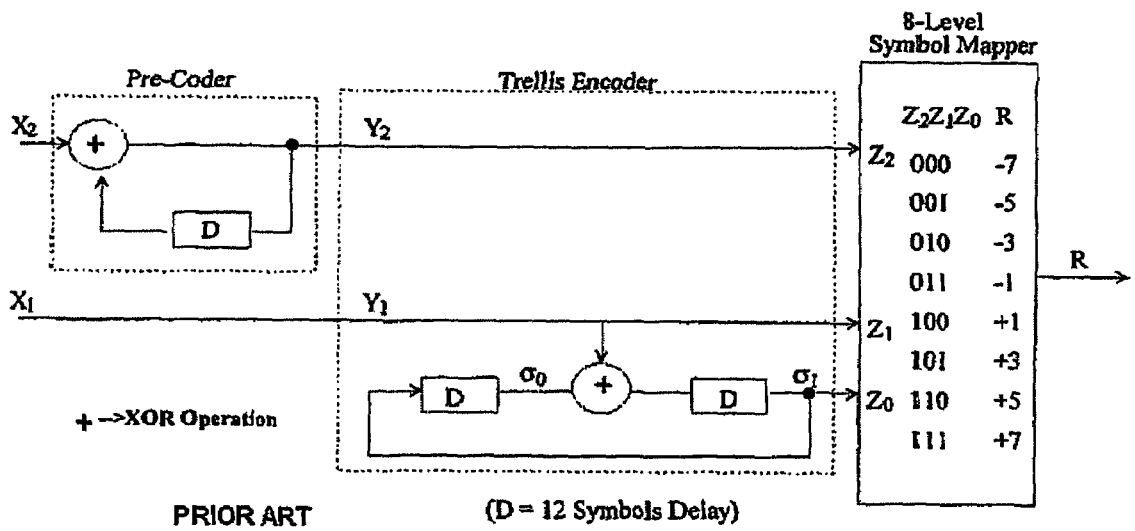
FIG. 2 is a block diagram of an ATSC HDTV trellis encoder, differential precoder and symbol mapper.
Figure 3:
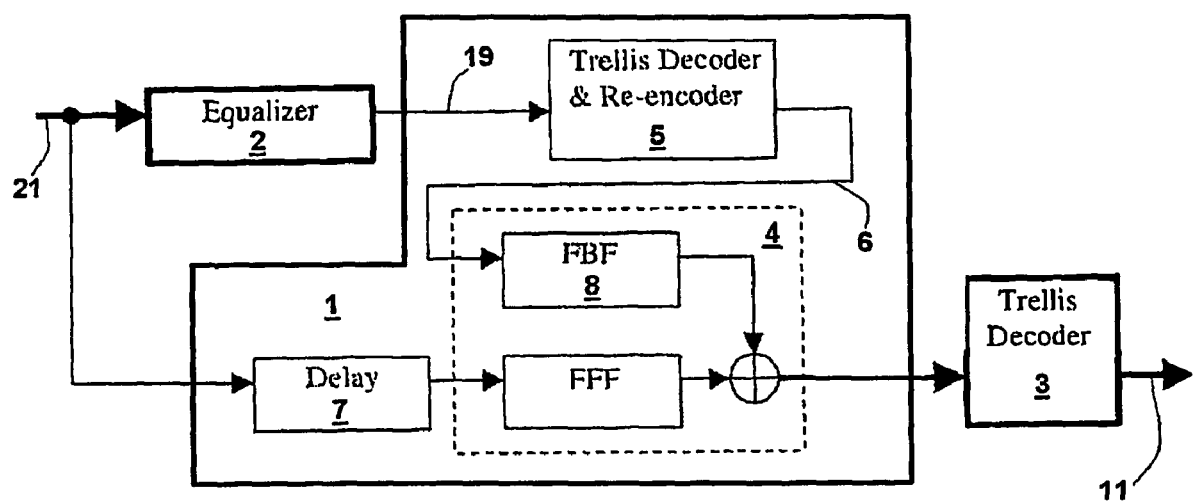
FIG. 3 is a simplified block diagram of the concatenated equalizer/trellis decoder system constructed according to the principles of the present invention.

Referring to FIG. 3, a simplified block diagram of the present invention shows a decision feedback equalizer module 1 that is interconnected to a first equalizer 2 and a trellis decoder 3 as would be present in a conventional DFE. The improved DFE module 1 can be replicated as many times as needed in an HDTV receiver in order to achieve the desired performance for a given investment in hardware. The DFE module 1 includes a trellis decoder and re-encoder 5, which generates as an output 6 the optimum encoded sequence rather than the optimum decoded sequence. In a conventional ATSC HDTV system, the input data bits X1 and X2 are encoded as three bits Z2, Z1, and Z0, as shown in FIG. 2. Each three-bit word corresponds to one of the eight symbols R. The input bit X2 is processed by a precoder to provide encoded bit Z2. The input bit X1 is encoded as two bits Z1 and Z0 by the trellis encoder. In the DFE module 1, the decoder/re-encoder 5 is able to reduce the need for control and mapping logic which is associated with the bits per branch of a trellis network. Instead, additional memory is allocated to the decoder/re-encoder 5 for storing the encoded three bits per branch (Z2, Z1, and Z0) instead of the decoded two bits (the input data bits X1 and X2) sequence. The delay unit 7 causes a delay that is equivalent to and thereby accounts for the delay introduced by the decoder/re-encoder 5. The DFE module 1 includes a second equalizer 4 which is similar to the first equalizer 2 except that no slicer is required. Not shown in FIG. 3 are the functions of the lock detector and mode switch depicted in FIG. 1, which are still required but are not illustrated for the purpose of clarity.

The DFE module 1 can be constructed in at least two different forms according to the type of trellis decoder/re-encoder 5 that is utilized. In a first embodiment, the decoder/re-encoder 5 creates as an output 6 the hard decision data that would be generated by a typical re-encoder unit. This embodiment would create an output 6 that is equivalent to the slicer output in the traditional DFE architecture depicted in FIG. 1. However, this output has the advantage of the correction capability provided by the trellis decoder.

In a second embodiment, the output 6 is a soft decision version of the data and is obtained by utilizing a trellis decoder soft output algorithm, such as the soft output Viterbi algorithm (SOVA). See J. Hagenauer and P. Hoeher, "A Viterbi Algorithm with Soft-Decision Outputs and its Applications", Proceedings of GLOBECOM'89, pp.1680-1686, Nov. 27-30/1989, Dallas, Tex. Also see U.S. Pat. No. 5,467,132, entitled METHOD FOR DIGITAL TRANSMISSION OF HIERARCHICAL HDTV, EDTV AND SDTV TELEVISION SIGNALS, issued on Nov. 14, 1995 to Fazer et al. The SOVA algorithm is a relatively complex trellis decoding algorithm which creates a soft output version of the data by defining reliability bits that are a function of the metric values at the decoding instant. Although more complex than the hard decision decoding scheme, the soft output trellis decoder generates an input to the FBF filter 8 that improves immunity to error propagation.

Let L be the number of memory elements in the trellis encoder, $S=2^L$ be the number of states in the trellis diagram, M be the channel symbol alphabet size and K be the number of trellis branches merging to a state. In the ATSC HDTV case, (L, S, M, K)=(2, 4, 8, 4). Let I be the transmitted channel symbol vector and Z=I+N be the received vector where N is an AWGN vector. Assume that the classical Viterbi algorithm (VA) makes a final decision with delay $\delta$, $\delta$ being large enough so that all K survivor paths have been merged with sufficiently high probability. The decision consists of selecting the path with the smallest path metric. The path metric for the AWGN channel is given by $$\Lambda^{(k)} = \frac{E_s}{N_o} \sum_{j=n-\delta}^{n} (z_j - I_j^{(k)})^2, k = 1, 2, \ldots, K \quad (1)$$

where n is the length of the path, $I_j^{(k)}$ is the channel symbol for the $k^{th}$ path at time j and $E_s/N_o$ is the signal-to-noise ratio. With this form, we have $$P(Z|I^k) \approx e^{-\Lambda(k)}, k=1,2,\ldots,K \quad (2)$$

where $I^{(k)}$ is the channel symbol vector associated with the $k^{th}$ path and $P(Z|I^k)$ is the conditional probability of the received vector with respect to the channel symbol vector.

The reliability of each path with respect to the received vector is given by $$r^{(k)} = \frac{P(I^{(k)}|Z)}{\sum_{l=1}^{K} P(I^{(l)}|Z)} = \frac{P(Z, I^{(k)})}{\sum_{l=1}^{K} P(Z, I^{(l)})} = \frac{P(Z|I^{(k)})P(I^{(k)})}{\sum_{l=1}^{K} P(Z|I^{(l)})P(I^{(l)})} = \frac{e^{-\Lambda(k)}}{\sum_{l=1}^{K} e^{-\Lambda(l)}} \quad (3)$$

where it is assumed that $P(I^{(k)})$ is the same for all k, due to the equiprobability of the transmitted data. In the conventional VA, all the information along the path is removed except the hard decisions for the survival path, but SOVA updates the a posteriori probability along the survival path using the calculated reliability. That is, $$P_{jm}^{(sp)} = \sum_{k=1}^{K} p_{jm}^{(k)} \cdot r^{(k)}, j = n, n-1, \ldots, n-\delta \text{ and } m = 1, 2, \ldots, M \quad (4)$$

where $P_{jm}^{(sp)}$ is the a posteriori probability of the $m^{th}$ channel symbol at time j for the survival path (sp).

In one embodiment, a reasonable choice for the soft output 6 may be the conditional mean of the channel symbol along the (global) survival path, which is given by $$\tilde{I}_j = \sum_{m=1}^{M} P_{jm}^{(sp)} \cdot I(m) \quad (5)$$

where I(m) is the channel symbol corresponding to the label m=1,2, . . . ,M.

As an example, one could apply a Maximum-A-Posterior (MAP) decoding algorithm. Some MAP algorithms are described in P. Robertson, E. Villebrun and P. Hoeher, "A Comparison of Optimal and Sub-Optimal MAP Decoding Algorithms Operating in the Log Domain", Proceedings of ICC'95, Seattle, Wash., pp.1009-1013, June 1995. The SOVA decoder was considered since the HDTV system is not based on block processing and consequently, it is difficult to apply a bi-directional MAP decoder. However, sliding window MAP decoding and unidirectional MAP decoding algorithms can be applied to this system since the basic algorithm is the same.

Figure 4:
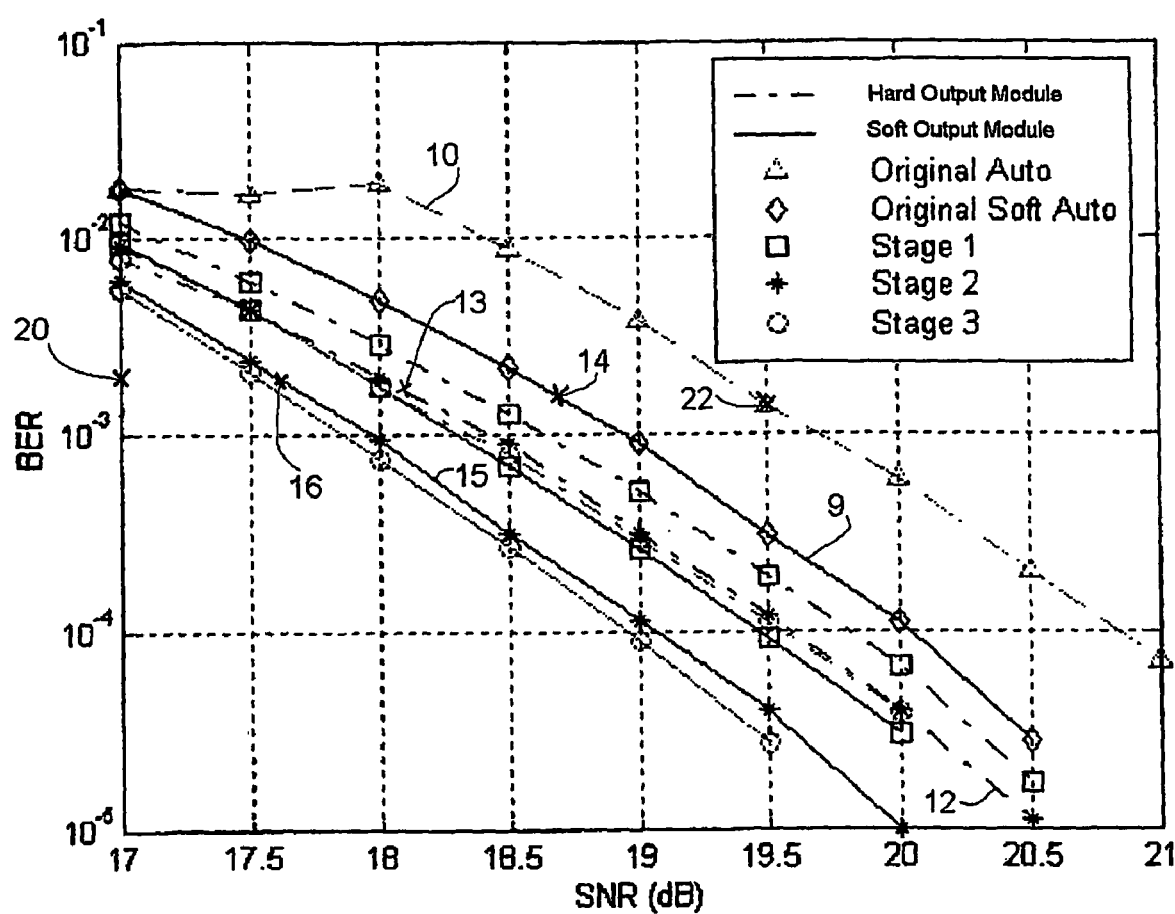
FIG. 4 is a graph showing the bit error rate versus the signal to noise ratio at the trellis decoder output for a first set of operating conditions, including those achieved by operation of the present invention.

Referring also to FIG. 4, a graph is presented that compares the Bit Error Rate (BER) to the Signal to Noise Ratio (SNR) for an HDTV receiver operating in the AWGN plus multipath channel. FIG. 4 shows curves for a hard output module 1 or a soft output module 1 when the original DFE 2 is in soft automatic decision mode: the original system without a module (marked by small diamonds, curve 9), the system with one module (marked by small squares), two modules (marked by stars, curves 12 and 15) and three modules (marked by small circles). In addition, FIG. 4 shows curve 10, representing the original system with the standard DFE in hard automatic switching mode. In this depiction, improved performance is indicated by obtaining the same error rate at a lower signal to noise ratio, or in other words, obtaining the same bit error rate when processing a weaker signal. The multipath channel that is the basis of the curves in FIG. 4 consists of a single three decibel (dB), three microsecond ghost, which can be characterized as a relatively strong ghost signal. The depicted performance is measured at the output 11 of the trellis decoder 3. The curve 10 depicts the performance at the output 11 of the trellis decoder 3, when module 1 is not present in FIG. 3 and the original DFE system depicted in FIG. 1 is operating in the automatic (hard) switching mode. In the (hard) automatic switching mode, the equalizer 2 is operating in the blind mode prior to convergence and switches to the hard, decision directed mode after convergence is detected. If convergence is lost, the equalizer 2 switches back to the blind operating mode.

The curve 9 is similar to curve 10 but depicts the performance of the first equalizer 2 in the soft automatic switching mode. In the soft automatic switching mode, the hard, decision directed mode is replaced by the soft decision directed mode, but is otherwise identical to the (hard) automatic switching mode for the purposes of switching based on the convergence status. When equalizer 2 is operating in the soft decision directed mode, the input to the FBF filter in FIG. 1 is the output of the equalizer 2 as opposed to the slicer output produced when operating in the (hard) automatic switching mode.

All of the comparisons that are to be made concerning the curves depicted in FIG. 4 are based on the Threshold of Visibility (TOV) point 20 for an ATSC HDTV system, which requires a bit error rate of approximately 0.002 at the trellis decoder output 11. The performance of curve 9 at its TOV point 14 results in an SNR requirement for input signal 21 of approximately 18.7 dB. Curve 12 represents the BER vs. SNR curve for two (and three) concatenated stages of the hard output embodiment of module 1, and at its TOV point 13 the input signal 21 is seen to have an SNR requirement of approximately 18.2 dB, representing a 0.5 dB gain in performance. When utilizing two stages of the soft output embodiment of module 1, represented by curve 15, the SNR requirement at the TOV point 16 is approximately 17.6 dB, representing an approximately 1.1 dB improvement over the original system operating in the soft automatic switching mode as depicted by curve 9. The two stage implementation of the soft output embodiment of module 1 has approximately 0.6 dB more gain than the corresponding hard output embodiment (17.6 dB vs. 18.2 dB, respectively), which comes at the expense of the increased complexity associated with the soft output (SOVA) algorithm. Finally, when the original system of the standard DFE of FIG. 1 depicted by curve 10 is compared at its TOV point 22 with the soft output embodiment of module 1, the performance improvement of the present invention is approximately 1.9 dB (17.6 dB at point 16 vs. 19.5 dB at point 22).

Figure 5:
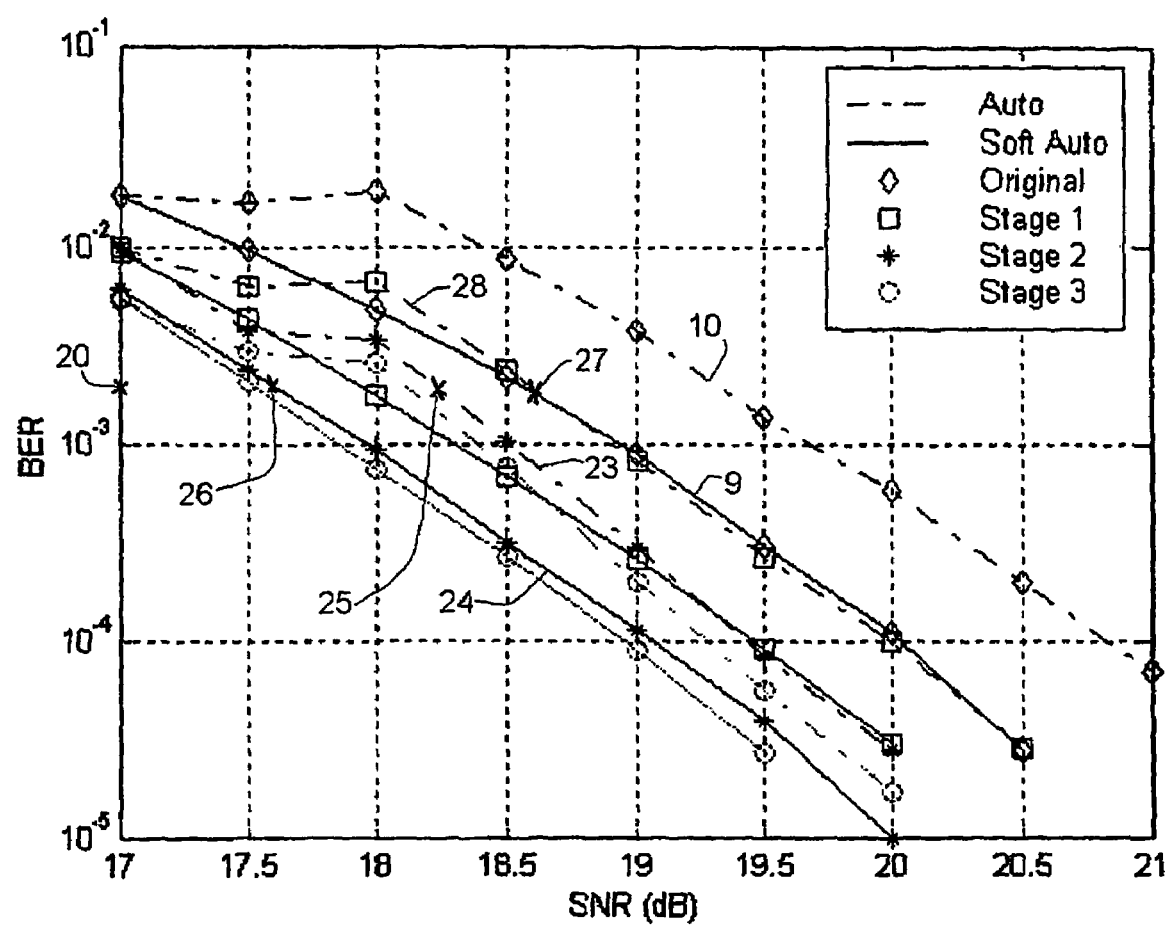
FIG. 5 is a graph showing the bit error rate versus the signal to noise ratio at the trellis decoder output for a second set of operating conditions, including those achieved by operation of the present invention.

The concatenated architecture of the present invention can also be associated with the original system shown in FIG. 1, in which the equivalent of first equalizer 2 is the standard DFE operating in the (hard) automatic switching mode. Although the results shown in FIG. 4 show improved performance when using the soft automatic switching mode for the first equalizer 2, this may not necessarily the case for all channels. FIG. 5 depicts the case of the BER versus SNR performance curves for the multipath channel consisting of a single three decibel, three microsecond ghost, which again is a relatively strong ghost signal. The performance depicted is measured at the trellis decoder output 11. FIG. 5 shows curves for a soft output module 1 when the original DFE 2 is either in hard automatic switching mode or soft automatic decision mode: the original systems without a module (curves 10 and 9), the systems with one output soft module (represented by small squares), two soft output modules (represented by stars, curves 23 and 24) and three soft output modules (represented by small circles). The curves 9 and 10 representing the original system of FIG. 1 in the soft and (hard) automatic modes, respectively, remain unchanged from FIG. 4. The remaining curves represent the use of the soft output embodiment of module 1 with first equalizer 2 in either the (hard) automatic switching mode or the soft automatic switching mode. The curve 23 represents the performance of the first equalizer 2 operating in the (hard) automatic switching mode when using two stages of module 1, and the TOV point 25 shows a SNR requirement at equalizer input 21 of approximately 18.2 dB. The curve 24 is for the first equalizer 2 operating in the soft automatic switching mode followed by two stages of module 1. The TOV point 26 shows an SNR requirement of 17.6 dB, or an approximately 0.6 dB improvement when compared to the (hard) automatic switching mode depicted by curve 23. For the higher SNR regions depicted by, for example, point 27 (greater than 18.6 dB), the curve 9 for the original system and soft automatic switching mode and the curve 28 for the (hard) automatic switching mode plus one soft output module 1 are seen to merge into approximately equivalent performance.

Although the concatenated equalizer/trellis decoder architecture of the present invention is designed primarily for use with the ATSC HDTV equalizer, the same principle can be usefully applied to any general equalizer arrangement that employs a DFE in a system where the equalizer is followed by a trellis or convolutional decoder. For such a system the error propagation into the DFE filter originated by linear distortion, noise and the presence of the slicer in the decision directed (dd) mode results in noise bursts at the equalizer output which will tend to impair decoder performance.

The invention claimed is:

1. In a system for processing a signal containing video data comprising groups of interleaved trellis encoded data packets, an apparatus for providing trellis decoded data, comprising:
    first means for adaptively filtering signal distortions;
    first means for identifying and re-encoding trellis decoded data as received from the first means for adaptively filtering signal distortions;
    a feedback filter responsive to the re-encoded trellis decoded data; and
    a trellis decoder responsive to an output signal generated by the feedback filter, the trellis decoder providing trellis decoded data.

2. A system according to claim 1, wherein the first means for adaptively filtering signal distortions is a first decision feedback equalizer.

3. A system according to claim 2, further including a second decision feedback equalizer comprising the feedback filter responsive to the re-encoded trellis decoded data.

4. A system according to claim 3, further comprising a module, the module comprising the second decision feedback equalizer and the first means for identifying and re-encoding trellis decoded data as received from the first means for adaptively filtering signal distortions.

5. A system according to claim 4, further comprising a plurality of modules, wherein a first module is responsive to data from the first means for adaptively filtering signal distortions, each succeeding module is responsive to data received from a preceding module and the last trellis decoder is responsive to data received from the last module.

6. A system according to claim 5, wherein each module further comprises:
    a delay unit for synchronizing data received from a previous stage; and
    a feed forward filter responsive to data received from the delay unit.

7. A system according to claim 6, wherein the first means for identifying and re-encoding trellis decoded data residing within the module is adapted to generate a hard decision data output.

8. A system according to claim 6, wherein the first means for identifying and re-encoding trellis decoded data residing within the module is adapted to generate a soft decision data output.

9. A system according to claim 8, wherein the first means for identifying and re-encoding trellis decoded data residing within the module is adapted to generate a soft decision data output satisfying an equation $$\tilde{I}_j = \sum_{m=1}^{M} P_{jm}^{(sp)} \cdot I(m)$$

where I(m) is a channel symbol corresponding to a label m=1,2, . . . ,M.

10. In a system for processing video data comprising groups of interleaved trellis encoded data packets, a method of providing trellis decoded data comprising the steps of:
    applying adaptive filtering to the video data and thereby generating a first output signal responsive to the adaptive filtering;
    decoding and re-encoding the first output signal and thereby generating a re-encoded output signal;
    applying the re-encoded output signal to a second adaptive filter and thereby generating a second output signal; and
    applying the second output signal to a trellis decoder and thereby generating a decoded output signal.

11. A system according to claim 10, further comprising the step of forming a module that performs the steps of:
    decoding and re-encoding the first output signal; and
    applying the re-encoded output signal to a second adaptive filter.

12. A system according to claim 11, wherein each module further comprises a delay unit for synchronizing data received from a previous stage.

13. A system according to claim 12, further comprising the step of cascading a plurality of modules so as to receive the first output signal and subsequently apply a final output signal to the trellis decoder and thereby generate the decoded output signal.

14. A system according to claim 13, further comprising the step of applying the re-encoded output signal within each module to the feedback filter in the same module.

15. A system according to claim 14, further comprising the step of decoding and re-encoding within each module so as to generate a re-encoded output signal that is a hard decision version of the interleaved trellis encoded data packets.

16. A system according to claim 14, further comprising the step of decoding and re-encoding within each module so as to generate a re-encoded output signal that is a soft decision version of the interleaved trellis encoded data packets.

17. A system according to claim 16, wherein the step of decoding and re-encoding trellis decoded data residing within each module generates a soft decision data output satisfying an equation $$\tilde{I}_j = \sum_{m=1}^{M} P_{jm}^{(sp)} \cdot I(m)$$

where I(m) is a channel symbol corresponding to a label m=1,2, . . . ,M and $P_{jm}^{(sp)}$ is the a posteriori probability of the $m^{(th)}$ channel symbol at time j for the survival path (sp).

18. An equalizer/trellis decoder system for processing high definition television signals, comprising:
a first adaptive filter;
a trellis decoder and re-encoder adapted to receive trellis encoded data packets from the first adaptive filter;
a second adaptive filter adapted to receive an input signal generated by the trellis decoder and re-encoder; and
a final trellis decoder adapted to receive an input signal from the second adaptive filter.

19. A system according to claim 18 wherein the first adaptive filter is a Decision Feedback Equalizer operating in either (hard) automatic switching mode or soft automatic switching mode.

20. The equalizer/trellis decoder system of claim 18 wherein the second adaptive filter is a decision feedback equalizer further comprising:
a feedback filter; and
a feed forward filter.

21. The equalizer/trellis decoder of claim 20 wherein an output signal generated by the trellis decoder and re-encoder produces hard decision data.

22. The equalizer/trellis decoder system of claim 20 further comprising a delay unit adapted to receive as an input a signal that is an input to the first adaptive filter, the delay unit being interconnected to and synchronizing data received by the feed forward filter.

23. The equalizer/trellis decoder of claim 22 wherein an output signal generated by the trellis decoder and re-encoder produces soft decision data.

24. A system according to claim 23, wherein the output signal generated by the trellis decoder and re-encoder satisfies an equation $$\tilde{I}_j = \sum_{m=1}^{M} P_{jm}^{(sp)} \cdot I(m)$$

where I(m) is the channel symbol corresponding to the label m=1,2, . . . ,M and $P_{jm}^{(sp)}$ is the a posteriori probability of the $m^{(th)}$ channel symbol at time j for the survival path (sp).

* * * * *